US011389819B2

(12) United States Patent
Mattero et al.

(10) Patent No.: US 11,389,819 B2
(45) Date of Patent: Jul. 19, 2022

(54) DISPENSING UNIT MASS DAMPENER

(71) Applicant: Illinois Tool Works Inc., Glenview, IL (US)

(72) Inventors: Patsy A. Mattero, Smithfield, RI (US); Fernando J. Aguiar, Westport, MA (US); Ronald J. Forget, Douglas, MA (US)

(73) Assignee: Illinois Tool Works Inc., Glenview, IL (US)

( * ) Notice: Subject to any disclaimer, the term of this patent is extended or adjusted under 35 U.S.C. 154(b) by 37 days.

(21) Appl. No.: 16/890,517

(22) Filed: Jun. 2, 2020

(65) Prior Publication Data

US 2021/0370341 A1   Dec. 2, 2021

(51) Int. Cl.
*B05C 5/02* (2006.01)
*B05D 1/26* (2006.01)
(Continued)

(52) U.S. Cl.
CPC .............. *B05C 5/0212* (2013.01); *B05D 1/26* (2013.01); *F16F 15/1485* (2013.01);
(Continued)

(58) Field of Classification Search
CPC .... B05C 5/0212; B05C 5/0225; B41J 25/308; B41J 25/3082; B41J 25/3086;
(Continued)

(56) References Cited

U.S. PATENT DOCUMENTS

| 4,382,422 A * | 5/1983 | Eddy ................... B05B 13/0242 |
| | | 118/302 |
| 6,394,568 B1 * | 5/2002 | Menendez ............. B41J 25/308 |
| | | 347/37 |

(Continued)

FOREIGN PATENT DOCUMENTS

| EP | 2972133 A1 | 1/2016 |
| EP | 3557968 A1 | 10/2019 |

(Continued)

OTHER PUBLICATIONS

Notification of Transmittal of the International Search Report and the Written Opinion of the International Search Authority from corresponding PCT/US2021/029922 dated Aug. 25, 2021.

*Primary Examiner* — Laura Edwards
(74) *Attorney, Agent, or Firm* — Lando & Anastasi, LLP

(57) ABSTRACT

A dispensing system includes a frame, a support, a dispensing unit assembly, and a gantry. The gantry is configured to support the dispensing unit assembly and to move the dispensing unit assembly in x-axis and y-axis directions. The dispensing unit assembly includes a support bracket secured to the gantry and a movable bracket rotatably coupled to the support bracket configured to enable the rotation of the movable bracket with respect to the support bracket about a first axis, with a dispensing unit rotatably coupled to the movable bracket configured to enable the rotation of the dispensing unit with respect to the movable bracket about a second axis generally perpendicular to the first axis. A mass dampener assembly is coupled to the movable bracket, with (Continued)

the mass dampener assembly being configured to reduce vibration of the dispensing unit during operation.

18 Claims, 9 Drawing Sheets

(51) Int. Cl.
*H05K 13/04* (2006.01)
*F16F 15/14* (2006.01)
*H01L 21/67* (2006.01)

(52) U.S. Cl.
CPC .......... *H05K 13/04* (2013.01); *H01L 21/6715* (2013.01); *H05K 2203/0126* (2013.01)

(58) Field of Classification Search
CPC ... B41J 25/3088; B41J 25/34; B05B 13/0278; F16F 15/1485; H05K 13/0469; H05K 3/0085; H05K 3/4644; H05K 3/1241; H05K 2203/0126; H01L 21/6715; B23K 3/0638; B05D 1/26

USPC ........ 118/305, 321, 323, 500, 679–681, 712, 118/713; 427/8, 96.1
See application file for complete search history.

(56) References Cited

U.S. PATENT DOCUMENTS

2003/0105603 A1\* 6/2003 Hardesty .............. G05B 19/401
702/95
2014/0263688 A1 9/2014 Doyle et al.

FOREIGN PATENT DOCUMENTS

WO 2014158484 A1 10/2014
WO WO2019/076560 \* 4/2019

\* cited by examiner

DISPENSING UNIT MASS DAMPENER

BACKGROUND OF THE DISCLOSURE

1. Field of the Disclosure

This disclosure relates generally to apparatus and methods for dispensing a viscous material on a substrate, such as a printed circuit board, and more particularly to a method and an apparatus for dispensing material on a substrate more accurately and with less vibration.

2. Discussion of Related Art

There are several types of dispensing systems used for dispensing precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto printed circuit boards. Automated dispensing systems are also used for dispensing lines of underfill materials and encapsulants, which may be used to mechanically secure components to the printed circuit board. Exemplary dispensing systems described above include those manufactured and distributed by Illinois Tool Works Electronic Assembly Equipment (ITWEAE), with offices at Hopkinton, Mass.

In a typical dispensing system, a dispensing unit is mounted to a moving assembly or gantry for moving the dispensing unit along three mutually orthogonal axes (x-axis, y-axis, and z-axis) using servomotors controlled by a computer system or controller. To dispense a dot of liquid on a printed circuit board or other substrate at a desired location, the dispensing unit is moved along the co-planar horizontal x-axis and y-axis directions until the dispensing unit is located over the desired location. The dispensing unit is then lowered along the perpendicularly oriented vertical z-axis direction until a nozzle/needle of the dispensing unit and dispensing system is at an appropriate dispensing height over the substrate. The dispensing unit dispenses a dot of liquid, is then raised along the z-axis, moved along the x- and y-axes to a new location, and is lowered along the z-axis to dispense the next liquid dot. For applications such as encapsulation or dispensing of underfill as described above, the dispensing unit is typically controlled to dispense lines of material as the dispensing unit is moved in the x- and y-axes along the desired path of the lines. For some types of dispensing units, such as jetting pumps, the z-axis movement prior to and subsequent to a dispense operation may not be required.

In designing a dispensing unit or head, accurate placing of viscous material on the substrate is desired. Reduction of vibration is of particular interest.

SUMMARY OF THE DISCLOSURE

One aspect of the present disclosure is directed to a dispensing system for dispensing viscous material on an electronic substrate. In one embodiment, the dispensing system comprises a frame, a support coupled to the frame, the support being configured to receive and support an electronic substrate during a dispense operation, a dispensing unit assembly configured to dispense viscous material, and a gantry coupled to the frame, the gantry being configured to support the dispensing unit assembly and to move the dispensing unit assembly in x-axis and y-axis directions. The dispensing unit assembly includes a support bracket secured to the gantry, a movable bracket rotatably coupled to the support bracket configured to enable the rotation of the movable bracket with respect to the support bracket about a first axis, a dispensing unit rotatably coupled to the movable bracket configured to enable the rotation of the dispensing unit with respect to the movable bracket about a second axis generally perpendicular to the first axis, and a mass dampener assembly coupled to the movable bracket, the mass dampener assembly being configured to reduce vibration of the dispensing unit during operation.

Embodiments of the dispensing system further may include the mass dampener assembly having a mass dampener coupled to the movable bracket by at least one isolator. The mass dampener assembly further may include a mounting plate configured to mount the mass dampener to the movable bracket. The mass dampener further may include at least one bumper configured to prevent at least one side wall of the mass dampener from engaging the movable bracket. The mass dampener assembly may be approximately 25% to 50% by weight of the dispensing unit. The mass dampener assembly may be approximately 10% by weight of the dispensing unit assembly. The movable bracket may be configured to rotate with respect to the support bracket up to an entire 360 degrees and the dispensing unit is configured to rotate with respect to the movable bracket up to an entire 360 degrees. The gantry may include a z-axis drive mechanism coupled to the dispensing unit to provide z-axis movement of the dispensing unit. The gantry further may include a beam configured to move in a y-axis direction, and a carriage coupled to the beam, with the carriage being configured to move in an x-axis direction. The carriage includes the z-axis mechanism to provide the z-axis movement of the dispensing unit. The support bracket may be L-shaped in construction having a first portion coupled to the gantry and a second portion that extends perpendicularly from the first portion, with the first portion of the support bracket being secured to the z-axis drive mechanism to provide the z-axis movement of the dispensing unit. The dispensing system further may include a vision system coupled to one of the frame and the gantry to capture at least one image of the electronic substrate. The dispensing system further may include a controller configured to control dispensing unit assembly, the gantry and the vision system to perform a dispense operation on the electronic substrate.

Another aspect of the present disclosure is directed to a method of dispensing viscous material on an electronic substrate. In one embodiment, the method comprises: delivering an electronic substrate to a dispense position; capturing at least one image of the electronic substrate; analyzing the at least one image of the electronic substrate to determine a position of the electronic substrate; and performing a dispense operation by rotating a dispensing unit coupled to a support bracket by a movable bracket. The movable bracket is rotatably coupled to the support bracket and configured to enable the rotation of the movable bracket with respect to the support bracket about a first axis. The dispensing unit is rotatably coupled to the movable bracket and configured to enable the rotation of the dispensing unit with respect to the movable bracket about a second axis generally perpendicular to the first axis. The dispensing unit includes a mass dampener assembly coupled to the movable bracket, with the mass dampener assembly being configured to reduce vibration of the dispensing unit during operation.

Embodiments of the method further may include the mass dampener assembly having a mass dampener coupled to the movable bracket by at least one isolator. The mass dampener assembly further may include a mounting plate configured to mount the mass dampener to the movable bracket. The mass dampener further may include at least one bumper configured to prevent at least one side wall of the mass dampener from engaging the movable bracket. The mass dampener assembly may be approximately 25% to 50% by weight of the dispensing unit. The mass dampener assembly may be approximately 10% by weight of the dispensing unit assembly. The movable bracket may be configured to rotate with respect to the support bracket up to an entire 360-degrees and the dispensing unit is configured to rotate with respect to the movable bracket up to an entire 360 degrees. The method further may include moving the dispensing unit in a z-axis direction.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE DISCLOSURE

Figure 1:
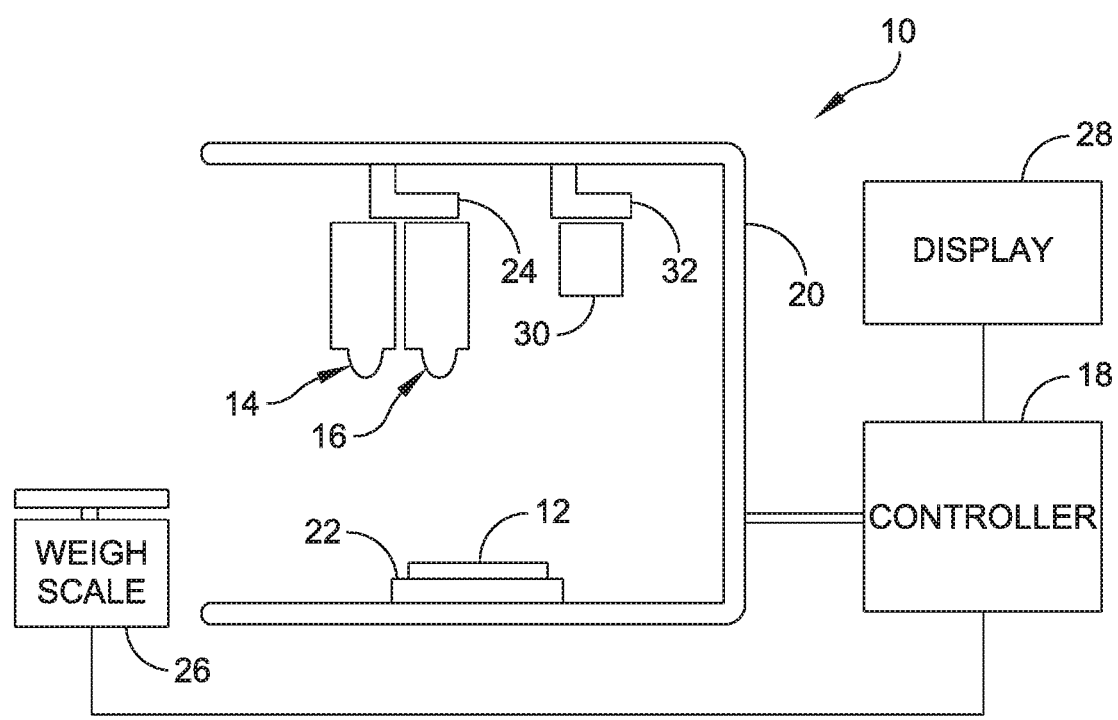
FIG. 1 is a schematic view of a dispensing system.

Various embodiments of the present disclosure are directed to viscous material dispensing systems, devices including dispensing systems. Embodiments disclosed herein are directed to techniques for dispensing material on an electronic substrate by a dispensing system having a dispensing unit that is configured to tilt and rotate to dispense material onto the electronic substrate and to eliminate unwanted vibration during the dispensing process.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

FIG. 1 schematically illustrates a dispensing system, generally indicated at 10, according to one embodiment of the present disclosure. The dispensing system 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispensing system 10 may alternatively be used in other applications, such as for applying automotive gasketing material or in certain medical applications or for applying conductive inks. It should be understood that references to viscous or semi-viscous materials, as used herein, are exemplary and intended to be non-limiting. In one embodiment, the dispensing system 10 includes first and second dispensing units, generally indicated at 14 and 16, respectively, and a controller 18 to control the operation of the dispensing system. It should be understood that dispensing units also may be referred to herein as dispensing pumps and/or dispensing heads. Although two dispensing units are shown, it should be understood that a single dispensing unit or multiple dispensing can be employed.

The dispensing system 10 may also include a frame 20 having a base or support 22 for supporting the electronic substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispensing system 10 to control loading and unloading of electronic substrates to and from the dispensing system. The gantry 24 can be moved using motors under the control of the controller 18 to position the dispensing units 14, 16 at predetermined locations over the electronic substrate. The dispensing system 10 may include a display unit 28 connected to the controller 18 for displaying various information to an operator. There may be an optional second controller for controlling the dispensing units. Also, each dispensing unit 14, 16 can be configured with a z-axis sensor to detect a height at which the dispensing unit is disposed above the electronic substrate 12 or above a feature mounted on the electronic substrate. The z-axis sensor is coupled to the controller 18 to relay information obtained by the sensor to the controller.

Prior to performing a dispensing operation, as described above, the electronic substrate, e.g., the printed circuit board, must be aligned or otherwise in registration with a dispensing unit of the dispensing system. The dispensing system further includes a vision system 30, which, in one embodiment, is coupled to a vision system gantry 32 movably coupled to the frame 20 for supporting and moving the vision system. In another embodiment, the vision system 30 may be provided on the dispensing unit gantry 24. As described, the vision system 30 is employed to verify the location of landmarks, known as fiducials, or components on the electronic substrate. Once located, the controller can be programmed to manipulate the movement of one or more of the dispensing units 14, 16 to dispense material on the electronic substrate.

Systems and methods of the present disclosure are directed to dispensing material onto an electronic substrate, e.g., a printed circuit board. The description of the systems and methods provided herein reference exemplary electronic substrates 12 (e.g., printed circuit boards), which are supported on the support 22 of the dispensing system 10. In one embodiment, the dispense operation is controlled by the controller 18, which may include a computer system configured to control material dispensing units. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

Embodiments of the present disclosure are directed to a strain wave gear drive assembly that is configured to tilt and rotate a dispensing unit of a dispensing system. offer alternative and competitive means to accurately dispense simultaneously on one or more electronic substrates or two or more patterns associated with a single electronic substrate. The methods disclosed herein further support the use of various types of dispensing units, including, but not limited to, auger, piston and jetting pumps.

Figure 2:
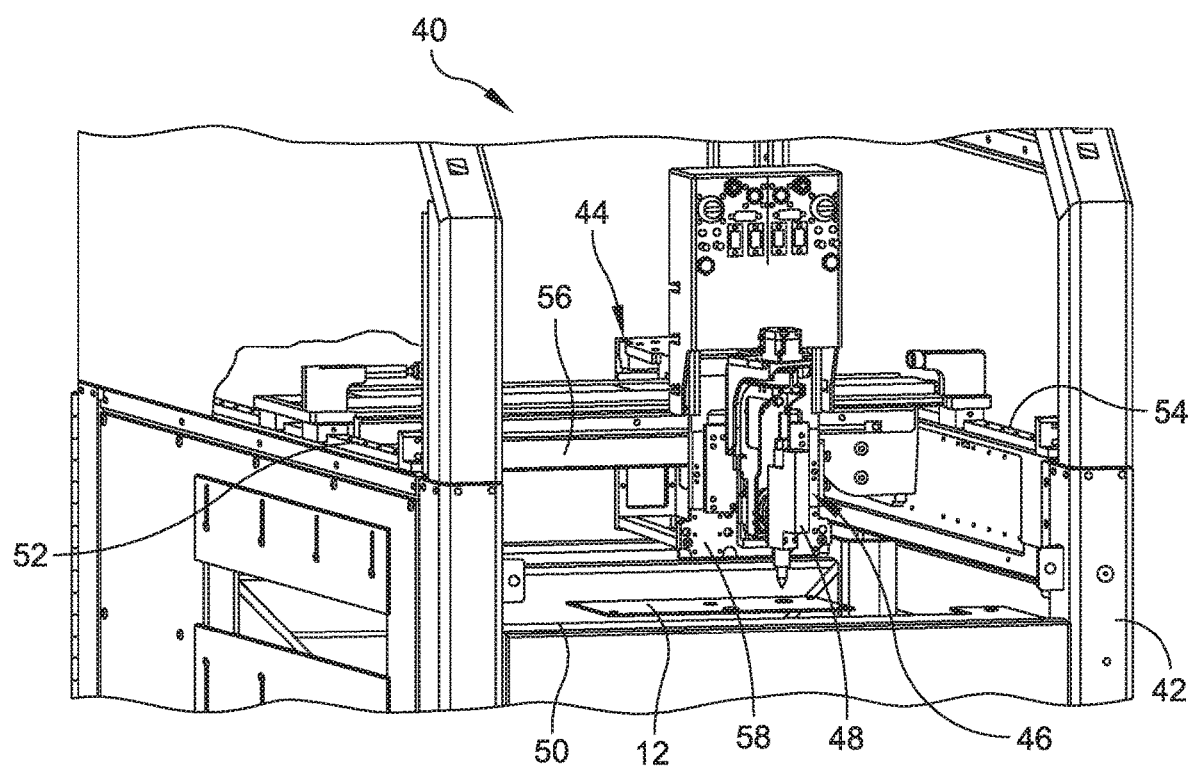
FIG. 2 is a perspective view of a dispensing system with packaging removed to disclose a dispensing system configured to manipulate a single dispensing unit.
Figure 3:
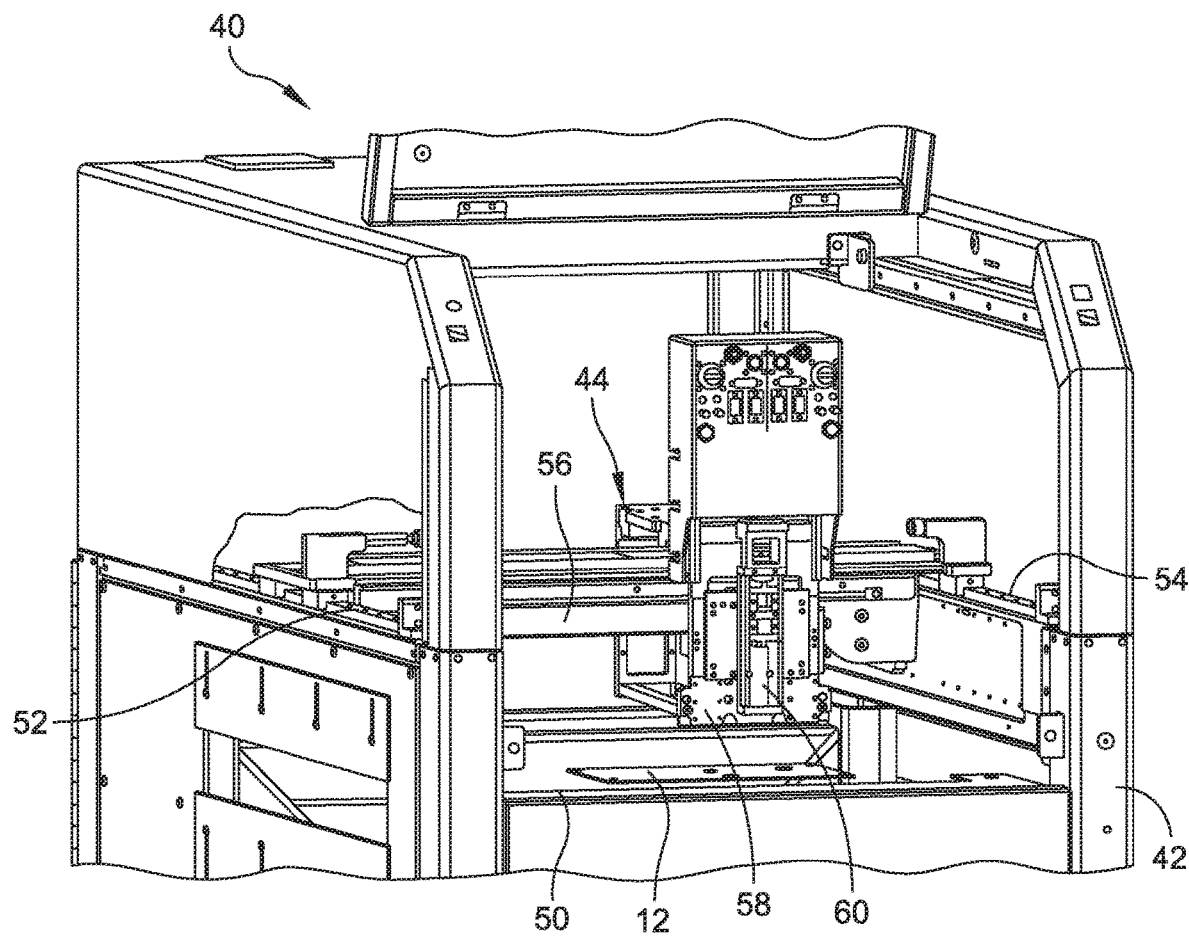
FIG. 3 is a perspective view of the dispensing system shown in FIG. 2 with the dispensing unit removed.

Referring to FIGS. 2 and 3, a dispensing system is generally indicated at 40. As shown, the dispensing system 40 includes a frame 42 configured to support the major sub-assemblies of the dispensing system. The dispensing system 40 further includes a gantry system, generally indicated at 44, which is configured to move in x-axis and y-axis directions. The dispensing system 40 further includes a dispensing unit assembly, generally indicated at 46, which is supported by the gantry system 44. FIG. 2 illustrates the dispensing system 40 having the dispensing unit assembly 46 and FIG. 3 illustrates the dispensing system 40 with the dispensing unit assembly removed. As shown, the dispensing unit assembly includes a single dispensing unit 48. A conveyor system (not shown) may be used in the dispensing system 40 to control loading and unloading of substrates, e.g., electronic substrate 12, to and from a support 50 of the dispensing system. The gantry system 44 can be moved using motors under the control of a controller, in a manner similar to controller 18 of dispensing system 10, in the x-axis and y-axis directions to position the dispensing unit assembly 46 at predetermined locations over the electronic substrate.

In one embodiment, as shown in FIGS. 2 and 3, the gantry system 44 may be configured to include a left-hand side rail 52, a right-hand side rail 54, and a beam 56 that extends between the two side rails. The beam 56 is configured to move in a y-axis direction along the side rails 52, 54 to achieve y-axis movement of the dispensing unit assembly 46. The gantry system 44 further includes a carriage 58 that is coupled to the beam 56 and configured to move along a length of the beam to provide x-axis movement of the dispensing unit assembly 46. Specifically, the carriage 58 supports the dispensing unit assembly 46, and is configured to move along the length of the beam in the x-axis direction to move the dispensing unit 48 over desired locations of the electronic substrate 12 positioned on the support 50 of the dispensing system 40. In a certain embodiment, movement of the gantry system 44 (i.e., movement of the beam 56 and the carriage 58) in the x-y plane may be achieved by employing ball screw mechanisms driven by respective motors as is well known in the art.

In one embodiment, an exemplary dispensing system described herein may embody Camalot® dispensing systems sold by ITWEAE of Hopkinton, Mass.

The dispensing unit assembly 46 is configured to move the dispensing unit 48 in a z-axis direction by a z-axis drive mechanism 60, which is shown in FIG. 2. The amount of z-axis movement may be determined by measuring the distance between the tip of a needle (not shown) of the dispensing unit 48 and the electronic substrate 12. When moving, the dispensing unit 48 may be positioned at a nominal clearance height above the electronic substrate 12. The clearance height may be maintained at a relatively consistent elevation above the electronic substrate 12 when moving from one dispense location to another dispense location. Upon reaching a predetermined dispense location, the z-axis drive mechanism 60 lowers the dispensing unit 48 to the electronic substrate 12 so that dispensing of material on the electronic substrate may be achieved.

Still referring to FIGS. 2 and 3, the dispensing unit 48 is moved over the electronic substrate 12 in such a manner to perform a dispense operation with the dispensing unit. However, prior to dispensing, the position of the electronic substrate 12 with respect to the dispensing unit 48 is determined so that accurate dispensing may take place. Specifically, in one embodiment, the carriage 58 can be configured to include an optical element or camera that is designed to take an image of the electronic substrate 12. Although the camera is described to be mounted on the carriage 58, it should be understood that the camera may be separately mounted on the beam 56 or on an independent gantry. The camera may be referred to herein as a "vision system" or an "imaging system." To align the electronic substrate 12 with the dispensing unit 48 and gantry system 44, images of at least two fiducials provided on the electronic substrate 12 are taken by the camera. If the electronic substrate 12 is out of position, the gantry system 44 may be manipulated to account for the actual position of the electronic substrate. In one embodiment, the camera may be calibrated to determine a camera-to-needle offset distance for the dispensing unit 48.

In another embodiment, vision alignment and clearance height sensing can be achieved with a laser or another calibrated distance measurement device.

A dispensing system typically has a dispensing unit oriented vertically and thus perpendicular to a horizontally fixtured substrate. In some applications, it is advantageous to tip the dispensing unit 48 away from the vertical to deposit the material being dispensed in a location that would otherwise be inaccessible from the vertical orientation. As the tilted dispensing unit 48 is articulated to various desired orientations, it may also be advantageous to change not only the angle of the dispensing unit from the vertical, but also the direction in which the dispensing unit is tilted, perhaps to deposit material at the bottom edge of a part along more than one side.

As will be appreciated by those familiar with moving structures, the mechanisms utilized to tilt and rotate the dispensing unit 48 add mass and reduce the structural stiffness, since any added mechanism introduces addition compliance. As the supported mass is increased and the stiffness of the structure is reduced, the natural frequency of the assembly is lowered. Accordingly, it is incumbent upon the designer to provide the necessary degrees of freedom with a minimum of added mass and as stiff as structure as possible. Moreover, given the construction, unwanted vibration is a natural consequence to the mass added with a tilt and rotate design.

Embodiments of the dispensing system 40 of the present disclosure accomplish this goal by incorporating a very compact and highly integrated rotary actuator, such as those available from Harmonic Drive of Beverly, Mass., that includes a motor, a strain-wave harmonic reduction gear box and a very stiff rotary cross-roller bearing. The high level of integration in the strain-wave gear-box actuator serves to minimize added mass and compliance. The strain-wave gear-box further has the benefit of extremely low backlash. Also, the integrated motor, bearing and gear-box assembly serves to minimize the number of parts that must be purchased, assembled and tested.

Figure 4:
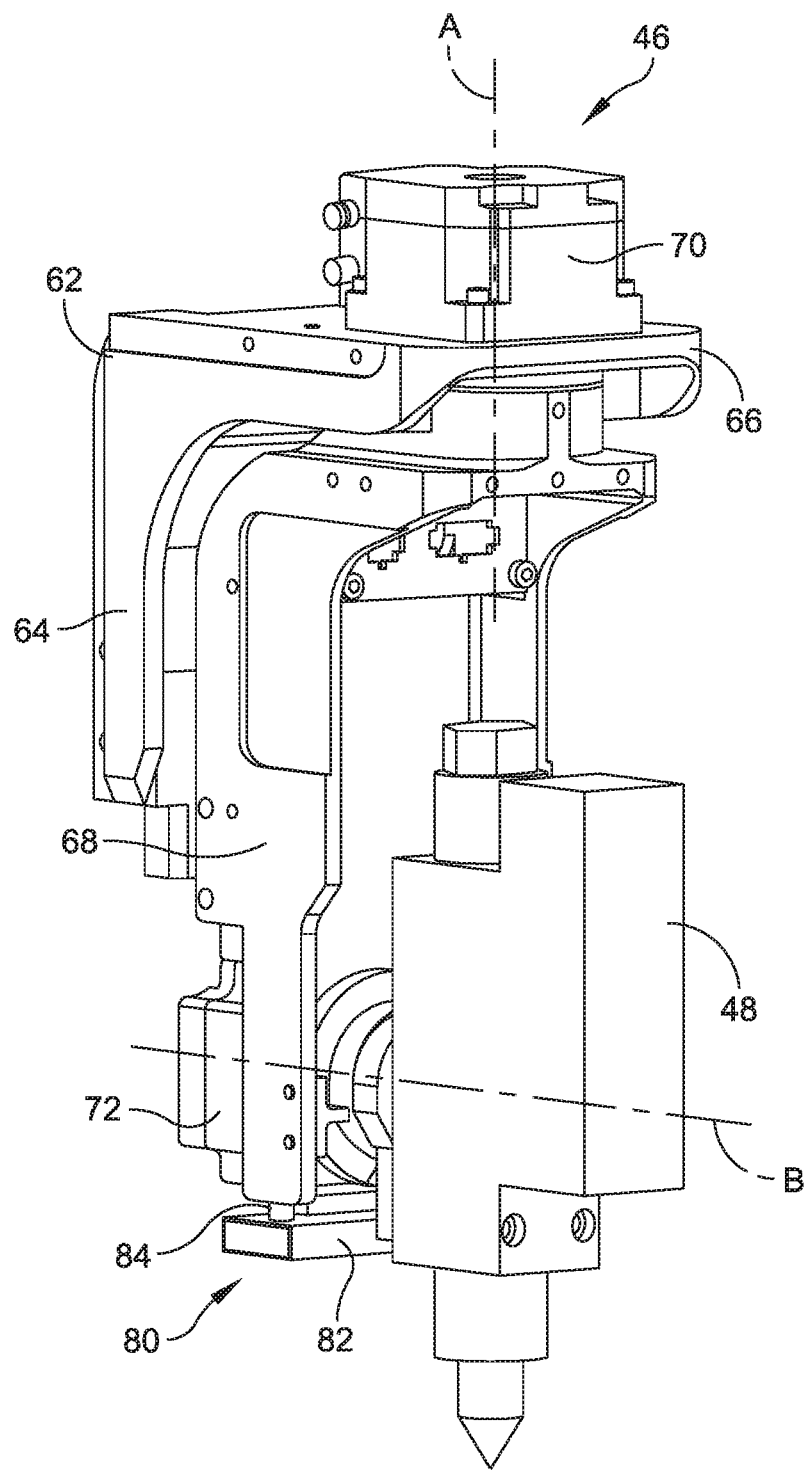
FIG. 4 is an enlarged perspective view of the dispensing unit having a mass dampener of an embodiment of the present disclosure.

Referring to FIG. 4, the dispensing unit assembly 46 includes a drive assembly configured to support the dispensing unit 48, which is shown in an operational position in FIG. 4. The dispensing unit assembly 46 can be removed from the components of the dispensing unit assembly configured to support the dispensing unit. As shown, the dispensing unit assembly 46 includes a support bracket 62 having an L-shaped construction in which a first portion 64 of the support bracket is secured to the z-axis drive mechanism 60 of the carriage 58 and a second portion 66 that extends perpendicularly from the first portion. The dispensing unit assembly 46 further includes a movable bracket 68 that is rotatably coupled to the support bracket 62 at the second portion 66 of the support bracket by a first strain wave gear system 70. In the shown embodiment, the movable bracket 68 is configured to rotate with respect to the support bracket 62 about a generally vertical axis A.

The movable bracket 68 includes a second strain wave gear system 72 that is configured to support the dispensing unit 48. The second strain wave gear system 72 may include a mounting plate that is configured to receive and support the dispensing unit 48 when the dispensing unit is in its operational position. The second strain wave gear system 72 is configured to rotate and tilt the dispensing unit 48 to a desired position during a dispense operation about an axis B, which is generally perpendicular to axis A. In one embodiment, the first strain wave gear system 70 is similarly if not identically constructed as the second strain wave gear system 72.

It should be understood that the orientation of the movable bracket 68 with respect to the support bracket 62 about axis A and the orientation of the dispensing unit 48 with respect to the movable bracket can be varied to accommodate a particular application. For example, the movable bracket 68 can be rotatably coupled to the support bracket 62 about a generally horizontal axis and the dispensing unit can be rotatably coupled to the movable bracket about a generally vertical axis.

Embodiments of the present disclosure are directed to a system and a method of dampening the vibration of a cantilevered load on the gantry driven dispensing unit 48. In some embodiments, loads on the dispensing unit 48 may cause sustained vibration which is detrimental to the performance of the dispensing unit. These vibrations can be of large enough magnitude and/or for a duration which will affect the accurate placement of dispensed material and required settle times which in turn negatively affect overall cycle time.

One object of the system and method of the present disclosure is to provide reduce vibration on the dispensing unit 48 such that accurate dispense placement is obtained with minimal settling time.

Embodiments of the dampener systems and methods disclosed herein may be used as in multiple application of cantilevered load on the dispensing unit 48 of the automated dispensing system 40.

Embodiments of the mass dampener systems and methods disclosed herein provide improved dispense placement accuracy and reduced settle times. Also, such systems and methods allow very close proximity dispensing without reduced chance of touching a component through vibration.

Figure 5:
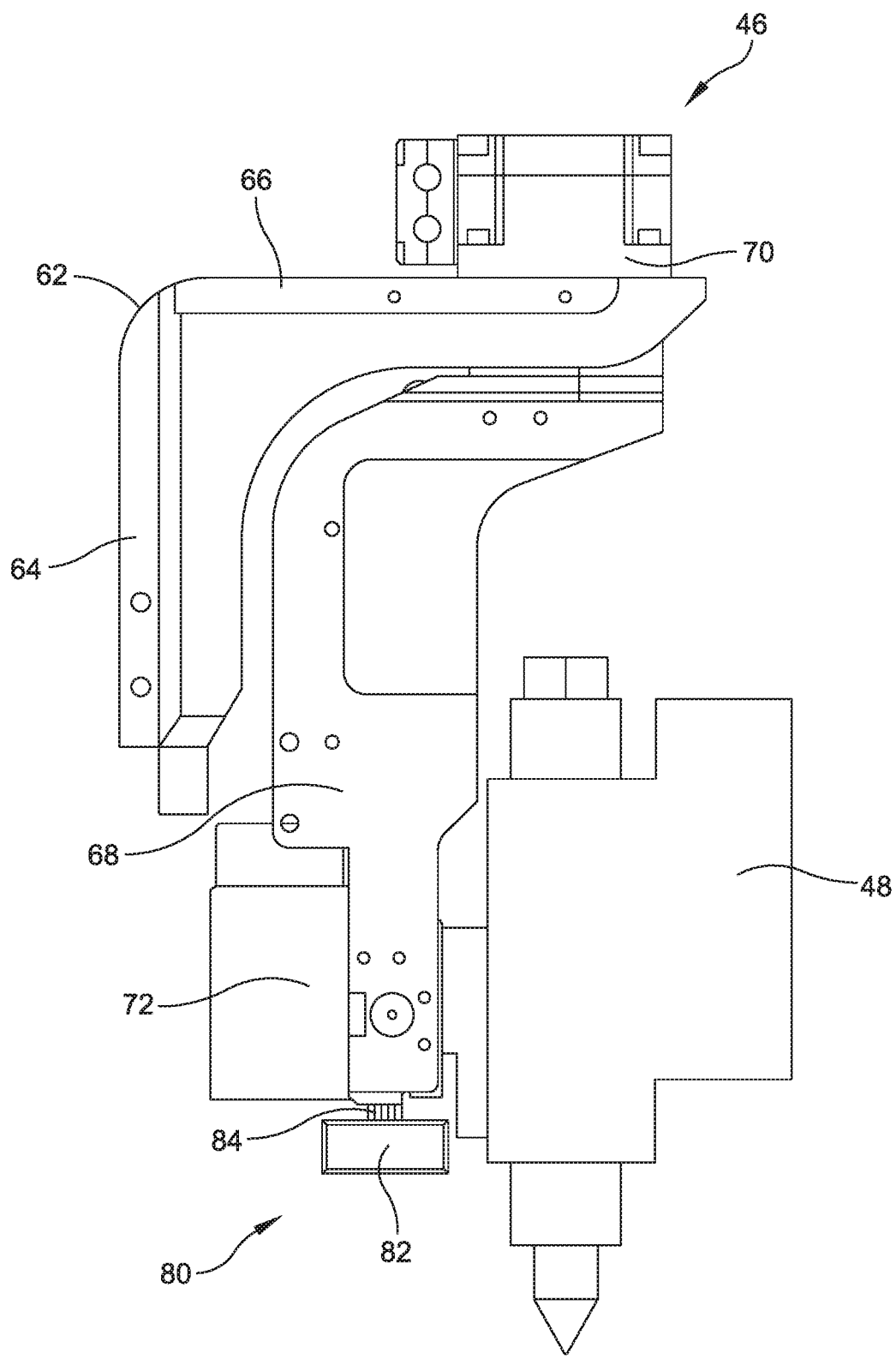
FIG. 5 is an enlarged side view of the dispensing unit having the mass dampener of FIG. 4.

Referring to FIG. 5, while there are known methods to address vibration by employing vibration damping and mass dampeners within machinery, with dispensing systems used to dispense viscous material, the application a mass dampener assembly, generally indicated at 80, is provided to reduce the vibration of the dispensing unit 48 during operation of the dispensing unit. In one embodiment, the mass dampener assembly 80 is mounted to the cantilevered articulating (movable) bracket 68. The mass dampener assembly 80 is configured to alleviate dispensed material inaccuracies due to the attached dispensing unit 48 by means of the cantilevered mounting system. Although the cantilevered mounting system being used herein may be a source of the unwanted vibration, the provision of the mass dampener system 80 is provided in the application in order for other features of the dispensing system 40 to work properly.

In the shown embodiment, the mass dampener assembly 80 is a tuned mass dampener utilizing a preselected weight, that includes a mass dampener 82 that is mounted on top of a threaded elastomer standoff or isolator 82, with one end of the standoff being rigidly mounted to the bottom of the movable bracket 68, and the other end of the standoff supporting the mass dampener. The preselected weight of the mass dampener 82 and the threaded elastomer standoff 84 can be altered if the frequency of the sinusoidal vibration is changed due to having different loads.

Figure 6:
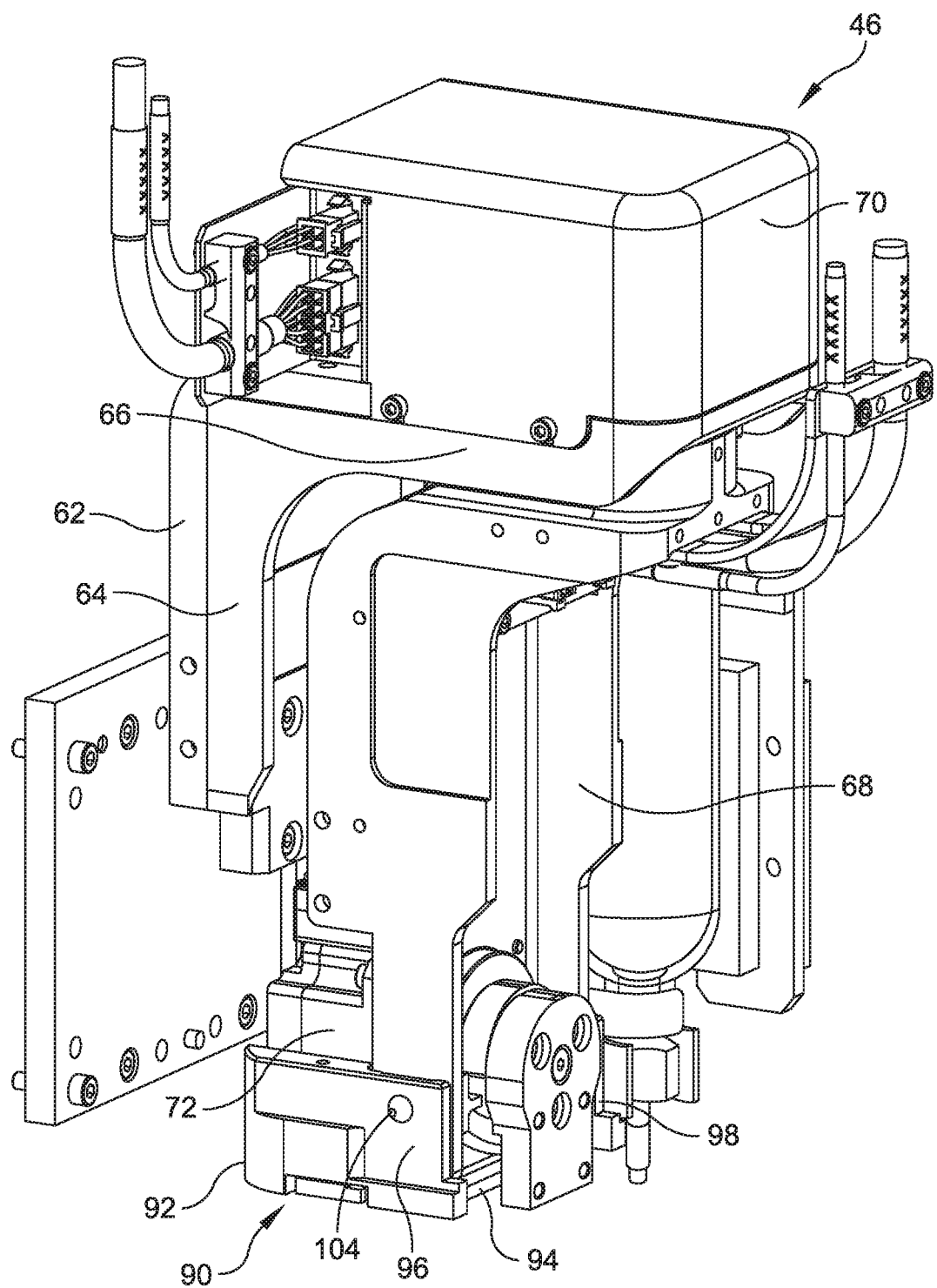
FIG. 6 is an enlarged perspective view of the dispensing unit having a mass dampener of another embodiment of the present disclosure.
Figure 7:
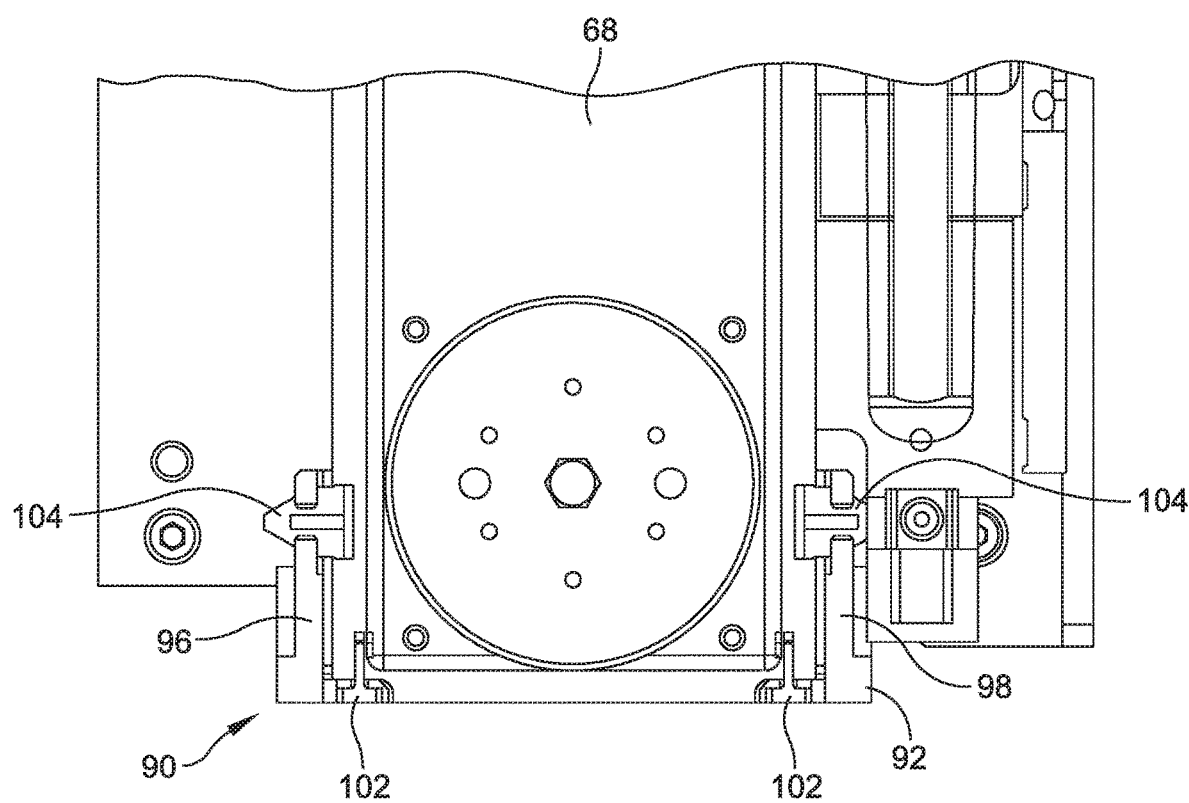
FIG. 7 is an enlarged side view of the dispensing unit having the mass dampener of FIG. 6.
Figure 8:
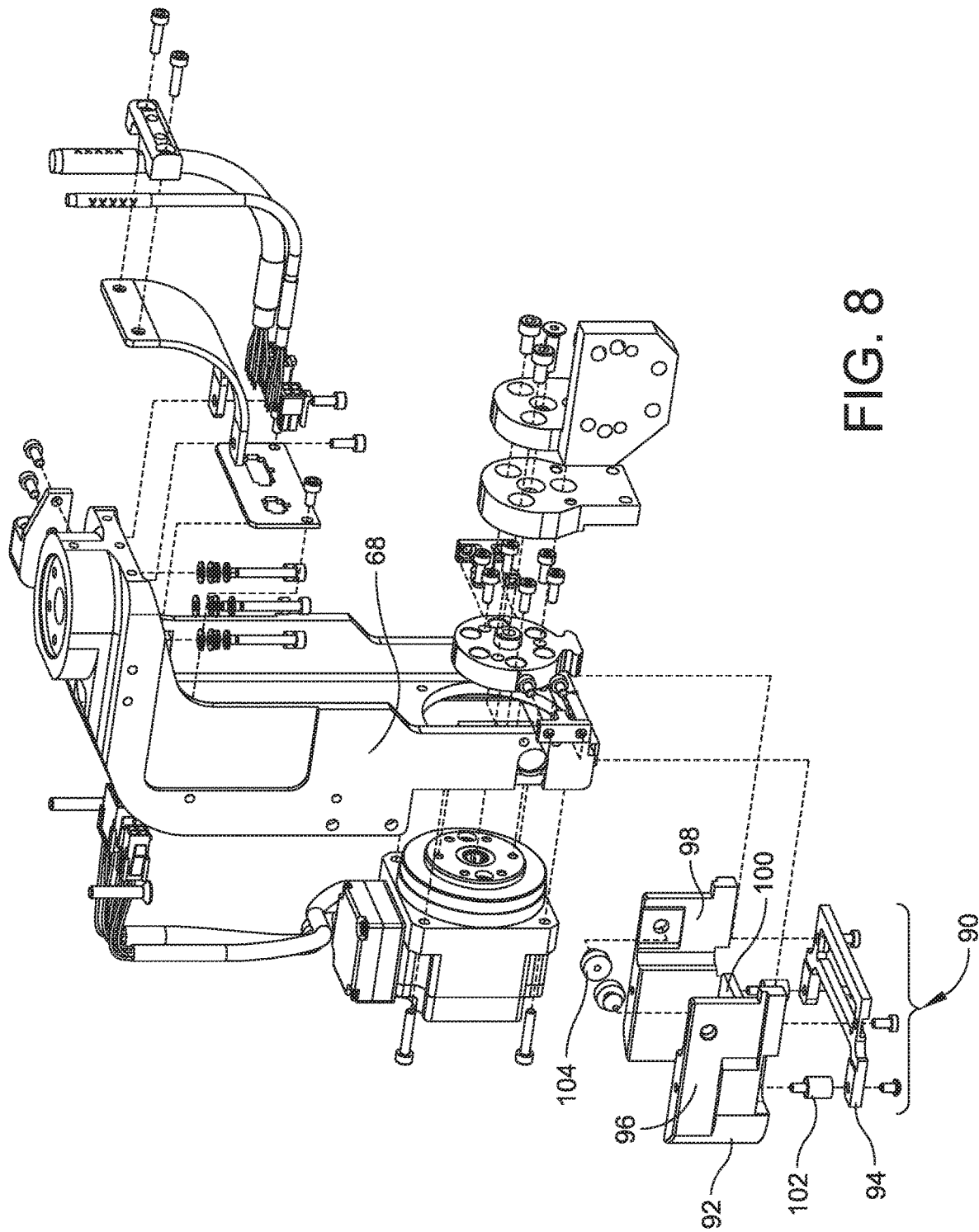
FIG. 8 is an exploded perspective view of the dispensing unit having the mass dampener shown in FIGS. 6 and 7.

Referring to FIGS. 6-8, a mass dampener assembly of another embodiment is generally indicated at 90. As shown, the mass dampener assembly 90 includes a generally U-shaped mass dampener 92 that is configured to span and be secured to the bottom of the movable bracket 68 and a mounting plate 94 that is provided to secure the mass dampener to the movable bracket by suitable fasteners. The mass dampener 92 includes two side walls 96, 98 that are connected to one another with a bottom wall 100. The mass dampener assembly 90 further includes a pair of threaded elastomer standoffs, each indicated at 102, to dampen the connection of the mass dampener 92 to the bottom of the movable bracket 68. Further provided are two bumpers, each indicated at 104, one for each side wall 96, 98 of the mass dampener 92, to dampen the impact of the side walls of the mass dampener with the bottom of the movable bracket 68 when moving the dispensing unit 48 quickly. The bumpers 104 further prevent sound from occurring during movement of the dispensing unit 48.

Figure 9:
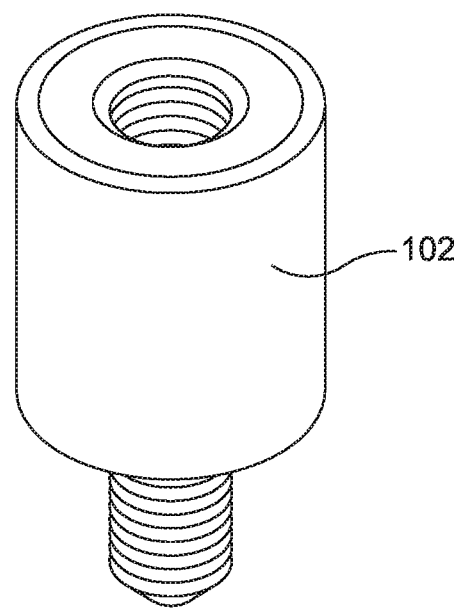
FIG. 9 is a perspective view of a threaded elastomer standoff of the mass dampener.

Referring to FIG. 9, the threaded elastomer standoff 102 includes a male threaded portion, which is attached to a threaded opening provided in the bottom of the movable bracket 68. The threaded elastomer standoff 102 further includes a female threaded portion, which receives a threaded fastener to secure the mounting plate 94 and the mass dampener 92 to the bottom of the movable bracket 92. The male threaded portion and the female threaded portion are inserts provided in an elastomeric material.

In one embodiment, the mass dampener assembly 90 weighs 0.5 pounds (lbs), which is approximately 50% of the weight of a one-pound dispensing unit 48 and approximately 25% of the weight of a two-pound dispensing unit. The 0.5 lbs mass dampener assembly 90 is approximately 10% of the weight of the cantilevered weight of the movable bracket 68, the dispensing unit 48 and associated parts, which can total between 4.5 to 5.5 lbs. In a certain embodiment, the threaded elastomer standoff 102 is configured to releasably secure the mass dampener 92 to the movable bracket 68 of the dispensing unit assembly. The mass dampener 92 of the mass dampener assembly 90 is configured so that it does not interfere with the movement of the dispensing unit 48 during operation.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A dispensing system for dispensing viscous material on an electronic substrate, the dispensing system comprising:
   a frame;
   a support coupled to the frame, the support being configured to receive and support an electronic substrate during a dispense operation;
   a dispensing unit assembly configured to dispense viscous material; and
   a gantry coupled to the frame, the gantry being configured to support the dispensing unit assembly and to move the dispensing unit assembly in x-axis and y-axis directions,
   wherein the dispensing unit assembly includes
      a support bracket secured to the gantry,
      a movable bracket rotatably coupled to the support bracket configured to enable the rotation of the movable bracket with respect to the support bracket about a first axis,
      a dispenser rotatably coupled to the movable bracket configured to enable the rotation of the dispenser with respect to the movable bracket about a second axis generally perpendicular to the first axis, and
      a mass dampener assembly coupled to the movable bracket, the mass dampener assembly being configured to reduce vibration of the dispenser during operation, the mass dampener assembly including a mass dampener coupled to the movable bracket by at least one isolator.

2. The dispensing system of claim 1, wherein the mass dampener assembly further includes a mounting plate configured to mount the mass dampener to the movable bracket.

3. The dispensing system of claim 1, wherein the mass dampener further includes at least one bumper configured to prevent at least one side wall of the mass dampener from engaging the movable bracket.

4. The dispensing system of claim 1, wherein the mass dampener assembly is approximately 25% to 50% by weight of the dispenser.

5. The dispensing system of claim 1, wherein the mass dampener assembly is approximately 10% by weight of the dispensing unit assembly.

6. The dispensing system of claim 1, wherein the movable bracket is configured to rotate with respect to the support bracket up to an entire 360 degrees and the dispenser is configured to rotate with respect to the movable bracket up to an entire 360 degrees.

7. The dispensing system of claim 1, wherein the gantry includes a z-axis drive mechanism coupled to the dispenser to provide z-axis movement of the dispenser.

8. The dispensing system of claim 7, wherein the gantry further includes a beam configured to move in a y-axis direction, and a carriage coupled to the beam, the carriage being configured to move in an x-axis direction, the carriage including the z-axis mechanism to provide the z-axis movement of the dispenser.

9. The dispensing system of claim 8, wherein the support bracket is L-shaped in construction having a first portion coupled to the gantry and a second portion that extends perpendicularly from the first portion, the first portion of the support bracket being secured to the z-axis drive mechanism to provide the z-axis movement of the dispenser.

10. The dispensing system of claim 1, further comprising a camera coupled to one of the frame and the gantry to capture at least one image of the electronic substrate.

11. The dispensing system of claim 10, further comprising a controller configured to control dispensing unit assembly, the gantry and the camera to perform a dispense operation on the electronic substrate.

12. A method of dispensing viscous material on the electronic substrate, the method comprising:
   providing a dispensing system of claim 1;
   delivering the electronic substrate to a dispense position;
   capturing at least one image of the electronic substrate;
   analyzing the at least one image of the electronic substrate to determine a position of the electronic substrate; and
   performing a dispense operation by rotating dispenser coupled to the support bracket by the movable bracket.

13. The method of claim 12, wherein the mass dampener assembly further includes a mounting plate configured to mount the mass dampener to the movable bracket.

14. The method of claim 12, wherein the mass dampener further includes at least one bumper configured to prevent at least one side wall of the mass dampener from engaging the movable bracket.

15. The method of claim 12, wherein the mass dampener assembly is approximately 25% to 50% by weight of the dispenser.

16. The method of claim 12, wherein the mass dampener assembly is approximately 10% by weight of the dispensing unit assembly.

17. The method of claim 12, wherein the movable bracket is configured to rotate with respect to the support bracket up to an entire 360-degrees and the dispenser is configured to rotate with respect to the movable bracket up to an entire 360 degrees.

18. The method of claim 12, further comprising moving the dispensing unit in a z-axis direction.

\* \* \* \* \*